US00RE49563E

(19) United States
(12) Reissued Patent
Shin et al.

(10) Patent Number: US RE49,563 E
(45) Date of Reissued Patent: Jun. 27, 2023

(54) NEGATIVE CAPACITANCE FET DEVICE WITH REDUCED HYSTERESIS WINDOW

(71) Applicant: Samsung Electronics Co., Ltd., Suwon-Si (KR)

(72) Inventors: Chang Hwan Shin, Seoul (KR); Eun Ah Ko, Seoul (KR)

(73) Assignee: Samsung Electronics Co., Ltd.

(21) Appl. No.: 17/672,019

(22) Filed: Feb. 15, 2022

Related U.S. Patent Documents

Reissue of:
(64) Patent No.: 9,831,239
Issued: Nov. 28, 2017
Appl. No.: 15/475,404
Filed: Mar. 31, 2017

U.S. Applications:
(63) Continuation of application No. 16/431,798, filed on Jun. 5, 2019, now Pat. No. Re. 49,015, which is an application for the reissue of Pat. No. 9,831,239.

(30) Foreign Application Priority Data

Dec. 30, 2016 (KR) ..... 10-2016-0183791

(51) Int. Cl.
*H01L 21/02* (2006.01)
*H01L 27/07* (2006.01)
(Continued)

(52) U.S. Cl.
CPC ..... *H01L 27/0733* (2013.01); *H01L 28/55* (2013.01); *H01L 28/60* (2013.01);
(Continued)

(58) Field of Classification Search
CPC ..... H01L 27/0733; H01L 28/55; H01L 28/60; H01L 28/65; H01L 29/66795; H01L 29/785
See application file for complete search history.

(56) References Cited

U.S. PATENT DOCUMENTS 8,362,604 B2 1/2013 Ionescu
8,653,510 B2 2/2014 Hodges et al.
(Continued)

FOREIGN PATENT DOCUMENTS

KR 101623380 B1 5/2016
KR 101639261 B1 7/2016

OTHER PUBLICATIONS

Khan, et al. "Negative Capacitance in Short-Channel FinFETs Externally Connected to an Epitaxial Ferroelectric Capacitor" IEEE Electron Device Letters 37(1):111-114 (Jan. 2016).
(Continued)

*Primary Examiner* — Tuan H Nguyen
(74) *Attorney, Agent, or Firm* — Myers Bigel, P.A.

(57) ABSTRACT

Provided is a negative capacitance FinFET device including a FinFET device including a gate stack, a drain electrode and a source electrode formed on a substrate and a ferroelectric negative capacitor connected to the gate stack of the FinFET device and having a negative capacitance. The FinFET device has an extension length ($L_{ext}$) from a side-wall of the gate stack to the drain electrode or the source electrode and the extension length is set such that a size of a hysteresis window in the negative capacitance FinFET device is 1 V or less.

20 Claims, 11 Drawing Sheets

(51) Int. Cl.
*H01L 29/78* (2006.01)
*H01L 49/02* (2006.01)
*H01L 29/66* (2006.01)

(52) U.S. Cl.
CPC ..... *H01L 28/65* (2013.01); *H01L 29/66795* (2013.01); *H01L 29/785* (2013.01)

(56) References Cited

U.S. PATENT DOCUMENTS

| | | | | |
|---|---|---|---|---|
| 8,785,995 | B2 | 7/2014 | Dubourdieu et al. | |
| 10,374,086 | B2 | 8/2019 | Hu | |
| 2016/0207761 | A1* | 7/2016 | Alam | H01L 27/0805 |
| 2017/0141235 | A1* | 5/2017 | Lai | H01L 29/6684 |
| 2017/0162702 | A1* | 6/2017 | Hu | H01L 29/78391 |

OTHER PUBLICATIONS

Khan et al. "Ferroelectric negative capacitance MOSFET: Capacitance tuning & antiferroelectric operation" 2011 International Electron Devices Meeting (pp. IEDM11-255-IEDM11-258) (Dec. 5-7, 2011).

* cited by examiner

NEGATIVE CAPACITANCE FET DEVICE WITH REDUCED HYSTERESIS WINDOW

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application *is a continuation of U.S. patent application Ser. No. 16/431,798, filed Jun. 5, 2019, now U.S. Pat. No. RE49,015, which is a reissue of U.S. patent application Ser. No. 15/475,404, filed Mar. 31, 2017, now U.S. Pat. No. 9,831,239, which* claims the benefit under 35 USC 119(a) of Korean Patent Application No. 10-2016-0183791 filed on Dec. 30, 2016, in the Korean Intellectual Property Office, the entire disclosures of which are incorporated herein by reference for all purposes.

TECHNICAL FIELD

The present disclosure relates to a negative capacitance FinFET device and a manufacturing method of the same.

BACKGROUND

The ever increasing power density of integrated circuits (ICs) has become a crucial limiting factor in preventing the continued growth of ICs in accordance with Moore's Law. For many years, significant effort has been applied to overcome the Boltzmann tyranny, i.e., to implement a 60-mV/decade subthreshold slope (SS) at room temperature.

Meanwhile, alternatives to complementary metal-oxide semiconductor (CMOS) devices have been proposed and studied, including tunnel field-effect transistors (TFETs), nano electro-mechanical system (NEMS), feedback field-effect transistors (FBFETs), etc.

Recently, ferroelectric materials for CMOS applications have also been proposed, and negative capacitance in ferroelectric capacitors formed of the ferroelectric materials has been experimentally demonstrated. That is, it was experimentally demonstrated that the two different electric polarization states of ferroelectric materials can lead to sudden increases in the drain current ($I_D$) of CMOS devices. For example, as an external voltage is applied to a ferroelectric negative capacitor, the negative capacitance in the ferroelectric negative capacitor is explicitly revealed by phase transition from an initial polarization state to an alternate state caused by the movement of the dipoles inside the ferroelectric layer.

However, in order to apply the ferroelectric negative capacitor to the industry, when the ferroelectric negative capacitor is used as a switching device for logic applications, a negative effect of a hysteresis window on the input transfer characteristics of the switching device needs to be improved.

SUMMARY

In view of the foregoing, the present disclosure provides a negative capacitance FinFET device including a FinFET device including a gate stack, a drain electrode and a source electrode formed on a substrate and a ferroelectric negative capacitor connected to the gate stack of the FinFET device and having a negative capacitance, and also provides a method of manufacturing the negative capacitance FinFET device.

Further, the present disclosure provides the negative capacitance FinFET device in which the FinFET device has an extension length $L_{ext}$ from a side-wall of the gate stack to the drain electrode or the source electrode and the extension length is set such that a size of a hysteresis window in the negative capacitance FinFET device is 1 V or less, and also provides a method of manufacturing the negative capacitance FinFET device.

According to an exemplary embodiment of the present disclosure, a negative capacitance FinFET device includes a FinFET device including a gate stack, a drain electrode and a source electrode formed on a substrate and a ferroelectric negative capacitor connected to the gate stack of the FinFET device and having a negative capacitance. The FinFET device may have an extension length ($L_{ext}$) from a side-wall of the gate stack to the drain electrode or the source electrode and the extension length may be set such that a size of a hysteresis window in the negative capacitance FinFET device is 1 V or less.

In an exemplary embodiment, the extension length may be set to be in a range from 80 nm to 150 nm.

In an exemplary embodiment, the extension length may be set to be in a range from 120 nm to 150 nm.

In an exemplary embodiment, the size of the hysteresis window in the negative capacitance FinFET device may be from 0.4 V to 0.5 V.

In an exemplary embodiment, a subthreshold slope (SS) of the negative capacitance FinFET device may be from 5 mV/decade to 60 mV/decade at room temperature.

In an exemplary embodiment, a subthreshold slope (SS) of the negative capacitance FinFET device may be from 5 mV/decade to 20 mV/decade at room temperature.

In an exemplary embodiment, the ferroelectric negative capacitor may include a substrate, a first electrode layer formed on the substrate, a ferroelectric layer formed on the first electrode layer, and a second electrode layer formed on the ferroelectric layer.

In an exemplary embodiment, the first electrode layer and the second electrode layer may include at least one of lantanium strontium manganite ($La_{0.7}Sr_{0.3}MnO_3$; LSMO), gold (Au), gadolinium scandate ($GdScO_3$), strontium ruthenate ($SrRuO_3$), silicon (Si), polysilicon, copper (Cu), silver (Ag), molybdenum (Mo), nickel (Ni), platinum (Pt), titanium (Ti), tantalum (Ta), and ruthenium (Ru).

In an exemplary embodiment, the ferroelectric layer may include at least one of PVDF [poly(vinylidenefluoride)], P(VDF-TrFE) [poly(vinylidenefluoride-trifluoroethylene)], PZT (lead zirconate titanate), BTO (barium titanate), BLT (bismuth lanthanum titanate), SBT (strontium bismuth tantalate), SLT (near-stoichiometric lithium tantalate), silicon-doped hafnium oxide (Si-doped $HfO_2$), hafnium zirconium oxide ($HfZrO_2$), and $PbZrTiO_3$.

According to another exemplary embodiment of the present disclosure, a manufacturing method of a negative capacitance FinFET device includes forming, on a substrate, a FinFET device including a gate stack, a drain electrode and a source electrode, and forming a ferroelectric negative capacitor connected to the gate stack of the FinFET device and having a negative capacitance. The FinFET device may have an extension length ($L_{ext}$) from a side-wall of the gate stack to the drain electrode or the source electrode, and the extension length may be set such that a size of a hysteresis window in the negative capacitance FinFET device is 1 V or less.

In an exemplary embodiment, the extension length may be set to be in a range from 80 nm to 150 nm.

In an exemplary embodiment, the extension length may be set to be in a range from 120 nm to 150 nm.

In an exemplary embodiment, the size of the hysteresis window in the negative capacitance FinFET device may be from 0.4 V to 0.5 V.

In an exemplary embodiment, a subthreshold slope (SS) of the negative capacitance FinFET device may be from 5 mV/decade to 60 mV/decade at room temperature.

In an exemplary embodiment, a subthreshold slope (SS) of the negative capacitance FinFET device may be from 5 mV/decade to 20 mV/decade at room temperature.

In an exemplary embodiment, the forming of a ferroelectric negative capacitor may include forming a substrate, forming a first electrode layer on the substrate, forming a ferroelectric layer on the first electrode layer, and forming a second electrode layer on the ferroelectric layer.

In an exemplary embodiment, the first electrode layer and the second electrode layer may include at least one of lantanium strontium manganite ($La_{0.7}Sr_{0.3}MnO_3$; LSMO), gold (Au), gadolinium scandate ($GdScO_3$), strontium ruthenate ($SrRuO_3$), silicon (Si), polysilicon, copper (Cu), silver (Ag), molybdenum (Mo), nickel (Ni), platinum (Pt), titanium (Ti), tantalum (Ta), and ruthenium (Ru).

In an exemplary embodiment, the ferroelectric layer may include at least one of PVDF [poly(vinylidenefluoride)], P(VDF-TrFE) [poly(vinylidenefluoride-trifluoroethylene)], PZT (lead zirconate titanate), BTO (barium titanate), BLT (bismuth lanthanum titanate), SBT (strontium bismuth tantalate), SLT (near-stoichiometric lithium tantalate), silicon-doped hafnium oxide (Si-doped $HfO_2$), hafnium zirconium oxide ($HfZrO_2$), and $PbZrTiO_3$.

According to any one of the exemplary embodiments of the present disclosure, it is possible to provide a negative capacitance FinFET device including a FinFET device including a gate stack, a drain electrode and a source electrode formed on a substrate and a ferroelectric negative capacitor connected to the gate stack of the FinFET device and having a negative capacitance, and also possible to provide a method of manufacturing the negative capacitance FinFET device.

Further, it is possible to provide the negative capacitance FinFET device in which the FinFET device has an extension length ($L_{ext}$) from a side-wall of the gate stack to the drain electrode or the source electrode and the extension length is set such that a size of a hysteresis window in the negative capacitance FinFET device is 1 V or less, and also possible to provide a method of manufacturing the negative capacitance FinFET device.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
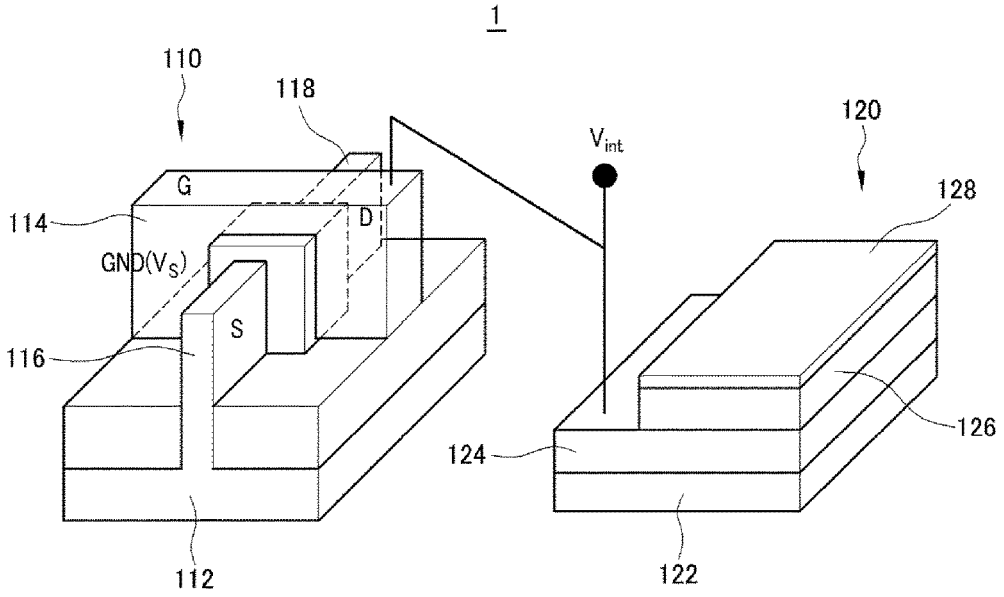
FIG. 1 is an exemplary diagram illustrating a negative capacitance FinFET device in accordance with an exemplary embodiment of the present disclosure.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, it is to be understood that the term "comprises or includes" and/or "comprising or including" used in the document means that one or more other components, steps, operation and/or existence or addition of elements are not excluded in addition to the described components, steps, operation and/or elements unless context dictates otherwise and is not intended to preclude the possibility that one or more other features, numbers, steps, operations, components, parts, or combinations thereof may exist or may be added.

Configuration of Negative Capacitance FinFET Device

FIG. 1 is an exemplary diagram illustrating a negative capacitance FinFET device in accordance with an exemplary embodiment of the present disclosure. Referring to FIG. 1, a negative capacitance FinFET device 1 includes a FinFET device 100 and a ferroelectric negative capacitor 120 having a negative capacitance.

The FinFET device 100 includes a substrate 112 and a gate stack 114, a source electrode 116 and a drain electrode 18 formed on the substrate 112. The FinFET device 100 may have a channel length of 100 nm or less. For example, the FinFET device 100 may have a channel length of 70 nm.

The ferroelectric negative capacitor 120 is connected to the gate stack 114 of the FinFET device 100 and has a negative capacitance.

The ferroelectric negative capacitor 120 includes a substrate 122, a first electrode layer 124 formed on the substrate 122, a ferroelectric layer 126 formed on the first electrode layer 124, and a second electrode layer 128 formed on the ferroelectric layer 126.

The substrate 122 may be, for example, a silicon (Si) substrate.

The first electrode layer 124 may be formed of, for example, lantanium strontium manganite ($La_{0.7}Sr_{0.3}MnO_3$; LSMO). Otherwise, the first electrode layer 124 may be formed of a material including at least one of gold (Au), gadolinium scandate ($GdScO_3$), silicon (Si), polysilicon, copper (Cu), silver (Ag), molybdenum (Mo), nickel (Ni), platinum (Pt), titanium (Ti), tantalum (Ta), and ruthenium (Ru).

The second electrode layer 128 may be formed of, for example, gold (Au)-titanium (Ti)-gold (Au). Otherwise, the second electrode layer 128 may be formed of a material including at least one of strontium ruthenate ($SrRuO_3$), silicon (Si), polysilicon, copper (Cu), silver (Ag), molybdenum (Mo), nickel (Ni), platinum (Pt), titanium (Ti), tantalum (Ta), and ruthenium (Ru).

The ferroelectric layer 126 may be formed of, for example, lead zirconium titanate ($PbZrTiO_3$). Otherwise, the ferroelectric layer 126 may be formed of a material including at least one of PVDF [poly(vinylidenefluoride)], P(VDF-TrFE) [poly(vinylidenefluoride-trifluomethylene)], PZT (lead zirconate titanate), BTO (barium titanate), BLT (bismuth lanthanum titanate), SBT (strontium bismuth tantalate), SLT (near-stoichiometric lithium tantalate), silicon-doped hafnium oxide (Si-doped $HfO_2$), and hafnium zirconium oxide ($HfZrO_2$).

The ferroelectric layer 126 serves as a material of a capacitor having a negative capacitance.

A conventional FinFET device has a subthreshold slope (SS) value of 60 mV/decade or more at room temperature.

However, if a ferroelectric material constituting the ferroelectric layer 126 is applied with a force equal to or greater than specific external energy, a phase of the molecules transitions. Therefore, unlike a conventional capacitor, the capacitor having a negative capacitance has a negative energy section during phase transition of the material.

Therefore, it is possible to implement a capacitor having a negative capacitance in a specific section with the ferroelectric layer 126.

Meanwhile, an overall capacitance of the negative capacitance FinFET device 1 of the present disclosure is increased by the ferroelectric layer 126, which has the same effect as amplification of a voltage.

Accordingly, it is possible to implement voltage amplification and particularly possible to increase a surface voltage in the gate stack 114 of the negative capacitance FinFET device 1 of the present disclosure.

Further, it is possible to improve a switching speed of the negative capacitance FinFET device 1 of the present disclosure.

Accordingly, the negative capacitance FinFET device 1 of the present disclosure may have a subthreshold slope equal to or lower than 60 mV/decade which is the physical limit. For example, the subthreshold slope of the negative capacitance FinFET device 1 may be from 5 mV/decade to 60 mV/decade at room temperature. Desirably, the subthreshold slope of the negative capacitance FinFET device 1 may be from 5 mV/decade to 20 mV/decade at room temperature.

Further, the negative capacitance FinFET device 1 of the present disclosure can be implemented at a driving voltage of 0.5 V or less, so that it is possible to implement a low-power device.

Figure 2A:
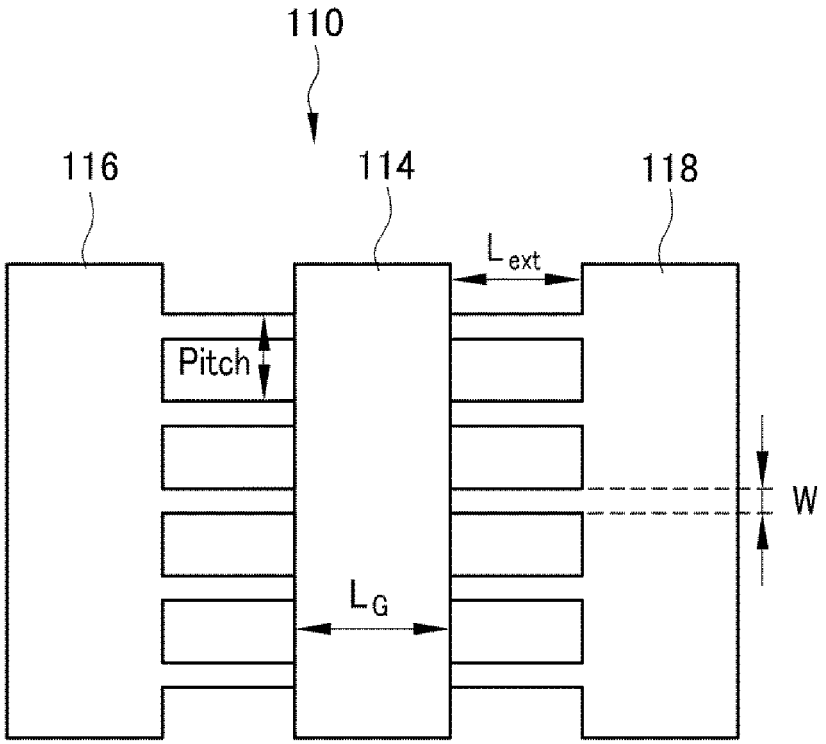
FIGS. 2A-2B provide exemplary diagrams illustrating a FinFET device in accordance with an exemplary embodiment of the present disclosure.
Figure 2B:
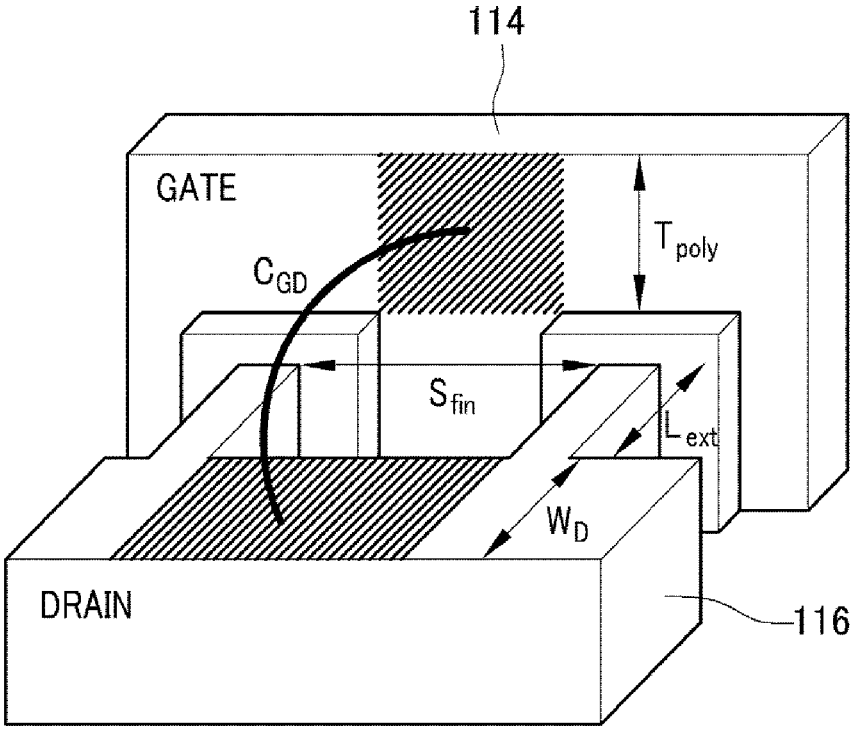

FIG. 2 provides exemplary diagrams illustrating a FinFET device in accordance with an exemplary embodiment of the present disclosure. Referring to FIG. 2A and FIG. 2B, a gate length ($L_G$) of the FinFET device 110 may be, for example, 70 nm. The FinFET device 110 may include, for example, five fins. A fin height of the FinFET device 110 may be, for example, 40 nm. A fin width W of the FinFET device 110 may be, for example, 40 nm. A pitch of the FinFET device 110 may be, for example, 200 nm. $C_{GD}$ may be a parasitic capacitance between a side-wall of the gate stack 114 and the top of the drain electrode 118.

The FinFET device 110 has an extension length $L_{ext}$ from the side-wall of the gate stack 114 to the source electrode 116 or the drain electrode 118.

The negative capacitance FinFET device 1 has hysteresis caused by remnant polarization of the ferroelectric negative capacitor 120. Further, a drain voltage also causes hysteresis of the negative capacitance FinFET device 1 due to electrostatic coupling between channel and drain regions.

Therefore, the hysteresis needs to be reduced in order to commercialize the negative capacitance FinFET device 1.

According to the present disclosure, by selecting the optimum extension length ($L_{ext}$) of the negative capacitance FinFET device 1, it is possible to reduce the hysteresis of the negative capacitance FinFET device 1 while maintaining the subthreshold slope of the negative capacitance FinFET device 1 to 20 mV/decade or less. Accordingly, it is also possible to drive the negative capacitance FinFET device 1 at a very low operating voltage.

For example, the negative capacitance FinFET device 1 may have the extension length ($L_{ext}$) that allows a hysteresis window to have a size of 1 V or less.

For example, the negative capacitance FinFET device 1 may have the extension length ($L_{ext}$) of from 80 nm to 150 nm. Desirably, the negative capacitance FinFET device 1 may have the extension length ($L_{ext}$) of from 120 nm to 150 nm.

Figure 3:
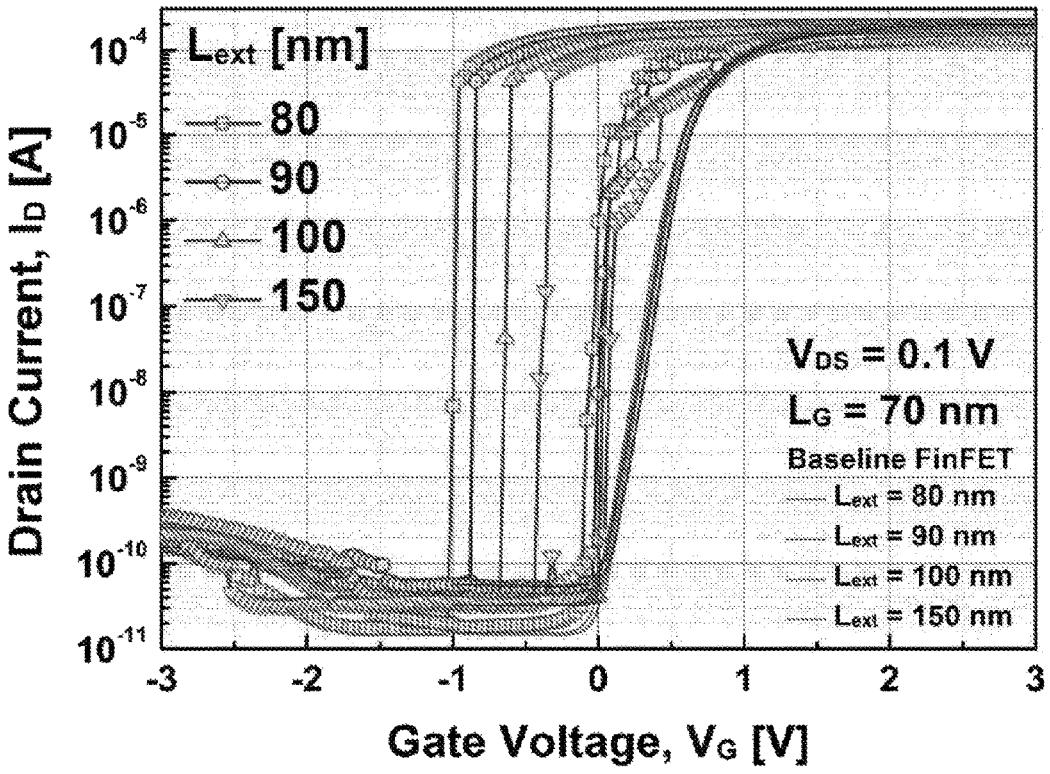
FIG. 3 is a diagram showing the input transfer characteristics of a negative capacitance FinFET device in accordance with an exemplary embodiment of the present disclosure.

Experiment on Hysteretic Characteristics Depending on Extension Length ($L_{ext}$) of Negative Capacitance FinFET Device FIG. 3 shows the input transfer characteristics of a negative capacitance FinFET device in accordance with an exemplary embodiment of the present disclosure. FIG. 3 shows the relationship between a gate voltage ($V_G$) and a drain current ($I_D$) of a baseline FinFET device and the negative capacitance FinFET device 1 having various extension lengths ($L_{ext}$).

Further, Table 1 compares hysteresis and subthreshold slope of the baseline FinFET device and the negative capacitance FinFET device 1 having various extension lengths ($L_{ext}$).

TABLE 1

| $L_{ext}$ of NC-FinFET [nm] | Hysteresis [V] | Reverse sweep SS [mV/dec] | Forward sweep SS [mV/dec] |
|---|---|---|---|
| 60 | 1.02 | 11.5 | 21.3 |
| 80 | 1 | 12.5 | 30.7 |
| 90 | 0.92 | 6.8 | 26.5 |
| 100 | 0.68 | 13.2 | 17.0 |
| 120 | 0.48 | 18.1 | 28.1 |
| 150 | 0.48 | 19.6 | 50.0 |
| Baseline FinFET | 0 | 111.7 | 99.9 |

Generally, a FinFET device using a conventional ferroelectric material has a hysteresis window size of from 3 V to 5 V and thus has been used for memory. For example, the negative capacitance FinFET device 1 having the extension length ($L_{ext}$) of 80 nm or less may have a hysteresis window size of 1 V or more. The negative capacitance FinFET device 1 having the extension length ($L_{ext}$) of 120 nm or more may have a hysteresis window size of 0.5 V or less.

However, when a phase of the ferroelectric material of the ferroelectric layer 126 transitions, an internal voltage (i.e., $V_{int}$, see FIG. 1 and FIG. 4A) of the ferroelectric negative capacitor 120 is amplified and a negative capacitance in the ferroelectric negative capacitor 120 results in a dramatic reduction of the subthreshold slope. Therefore, it can be seen that a subthreshold slope of all the negative capacitance FinFET devices 1 used in the experiment is equal to or less than 20 mV/decade in a reverse sweep of the gate voltage and equal to or less than the subthreshold slope of the conventional FinFET device in a forward sweep. Meanwhile, it can be seen that the baseline FinFET has a subthreshold slope of about 90 mV/decade at room temperature.

It has been experimentally verified that the hysteresis window in the negative capacitance FinFET device 1 can be suppressed as the extension length ($L_{ext}$) is increased. It can be seen that the hysteresis window of the negative capacitance FinFET device 1 is decreased from 1.02 V to 0.48 V as the extension length ($L_{ext}$) of the negative capacitance FinFET device 1 is increased from 60 nm to 150 nm.

Figure 4A:
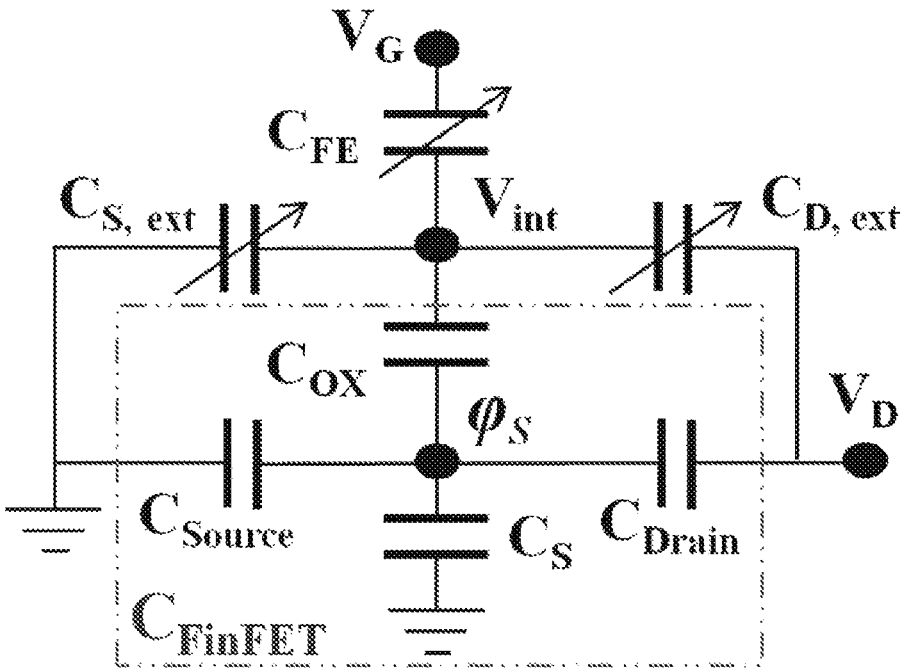
FIGS. 4A, 4B and 4C provide exemplary diagrams illustrating a capacitance model of a negative capacitance FinFET device in accordance with an exemplary embodiment of the present disclosure.
Figure 4B:
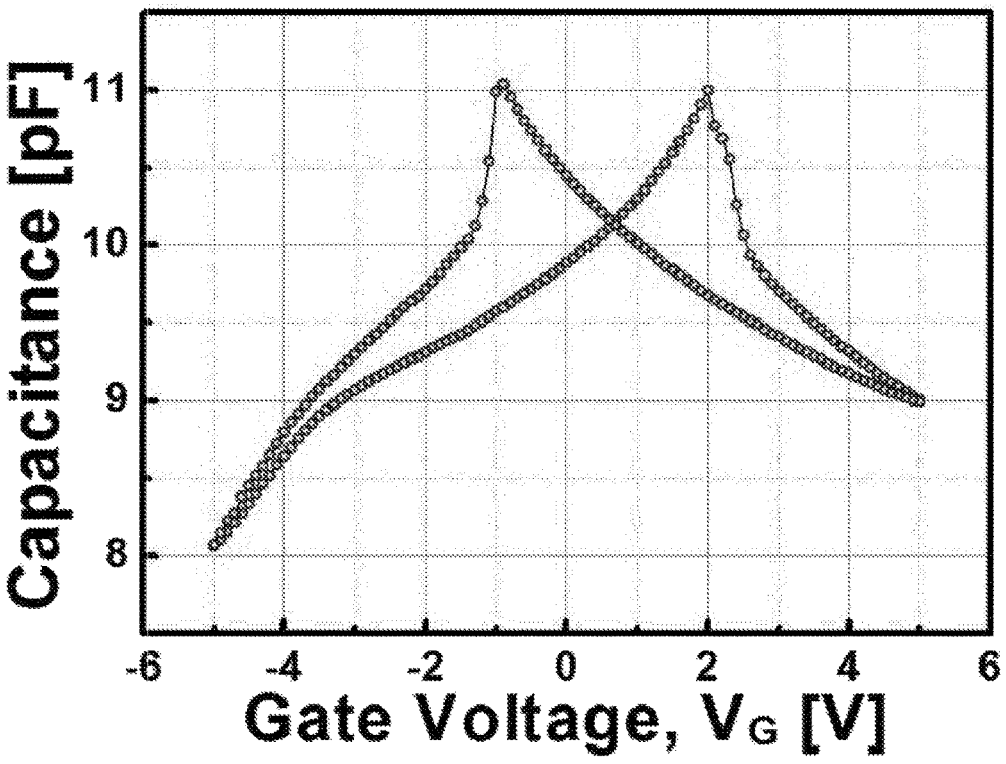
Figure 4C:
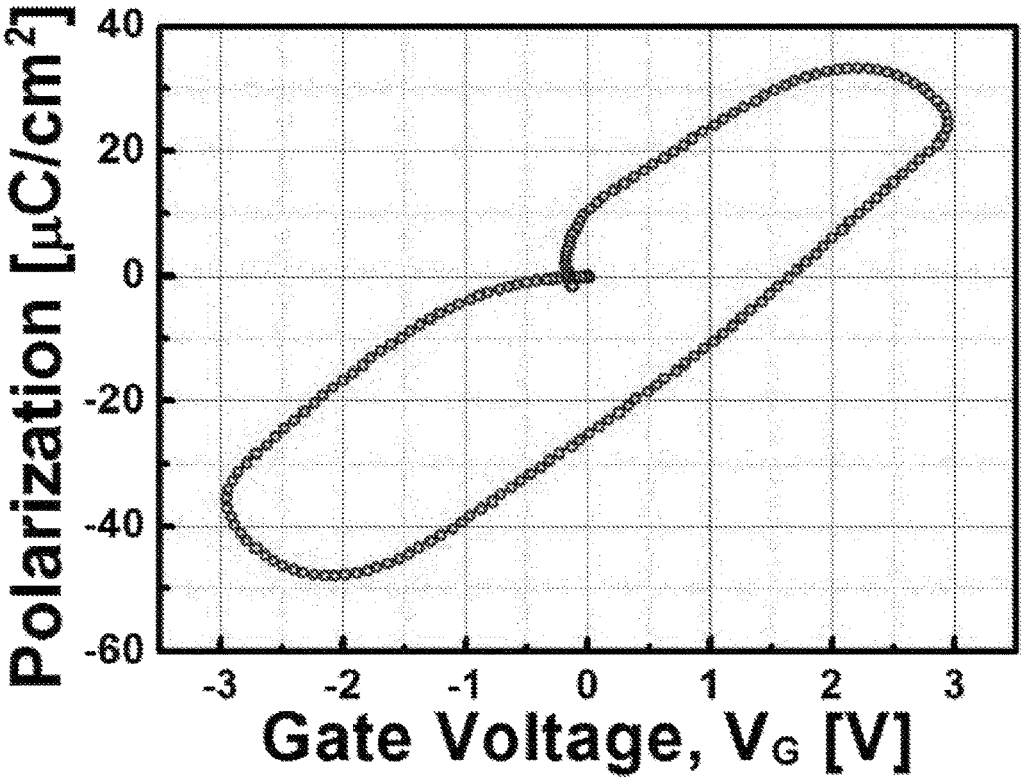

FIG. 4A is an exemplary diagram illustrating a capacitance model of a negative capacitance FinFET device in accordance with an exemplary embodiment of the present disclosure. FIG. 4B shows the relationship between a gate voltage and a capacitance of the capacitance model of the negative capacitance FinFET device in accordance with an exemplary embodiment of the present disclosure. FIG. 4C shows the relationship between a gate voltage and a polarization of the capacitance model of the negative capacitance FinFET device in accordance with an exemplary embodiment of the present disclosure.

Referring to FIG. 4A to FIG. 4C, $C_{Source}$ and $C_{Drain}$ are intrinsic source and drain capacitances, respectively, inside the FinFET device 110.

An extrinsic source capacitance ($C_{S,ext}$) and an extrinsic drain capacitance ($C_{D,ext}$) are primarily determined by a parasitic gate-to-source capacitance ($C_{GS}$) (not illustrated) and a parasitic gate-to-drain capacitance ($C_{GD}$) (see FIG. 2B) because the fin pitch of the negative capacitance FinFET device 1 of the present disclosure is five times wider than the fin width W. Herein, the parasitic gate-to-source capacitance ($C_{GS}$) is an extrinsic capacitance from the side-wall of the gate stack 114 above a fin spacing to the top surface of a source contact region. Further, the parasitic gate-to-drain capacitance ($C_{GD}$) is an extrinsic capacitance from the side-wall of the gate stack 114 above the fin spacing to the top surface of a drain contact region.

The equation for the parasitic gate-to-drain capacitance ($C_{GD}$) is as follows:

[Equation 1]

$$C_{GD} = \frac{2\varepsilon_{OX}}{\pi} S_{fin}^{\tau}\left(t_1 + t_2\exp\left(-\frac{T_{poly}}{t_3}\right)\right)\times\left(\ln\left(1+\frac{W_D}{L_{ext}}\right)\ln\left(1+\frac{T_{poly}}{t_{OX}}\right)\right) + \frac{\varepsilon_{OX}}{\pi-2}\ln\left(\frac{\pi}{2}\right)S_{fin}^{\tau}\left(t_4 + t_5\exp\left(-\frac{T_{poly}}{t_6}\right)\right) \quad \text{[Equation 1]}$$

Herein, $\in_{ox}$ is the dielectric constant of the oxide layer, and $\tau$ and $t_1$ to $t_6$ are the fitting parameters. $S_{fin}$ is the spacing between fins, and $T_{poly}$ is the spacing from the top of the gate insulation layer surrounding a fin and an upper end of the gate. $W_D$ is the length of the drain, and $t_{OX}$ is the thickness of the gate insulation layer (see FIG. 2B).

As the extension length ($L_{ext}$) of the negative capacitance FinFET device 1 is increased, the distance from the gate stack 114 of the FinFET device 110 to the source electrode 116 or the drain electrode 118 is increased and the parasitic gate-to-source capacitance ($C_{GS}$) and the parasitic gate-to-drain capacitance ($C_{GD}$) are decreased.

Further, as the parasitic gate-to-source capacitance ($C_{GS}$) and the parasitic gate-to-drain capacitance ($C_{GD}$) are decreased, the extrinsic source capacitance ($C_{S,ext}$) and the extrinsic drain capacitance ($C_{D,ext}$) are also decreased. As the extrinsic source capacitance ($C_{S,ext}$) and the extrinsic drain capacitance ($C_{D,ext}$) are decreased, a surface potential of the FinFET device 110 is decreased, so that the hysteresis window of the negative capacitance FinFET device 1 is decreased.

On the other hand, as the parasitic gate-to-drain capacitance ($C_{GD}$) is increased, the extrinsic drain capacitance ($C_{D,ext}$) is also increased. Consequently, the magnitude of a gate bias (i.e., $|V_G|$) for amplification of the internal voltage is also increased, which in turn increases the hysteresis window.

Figure 5A:
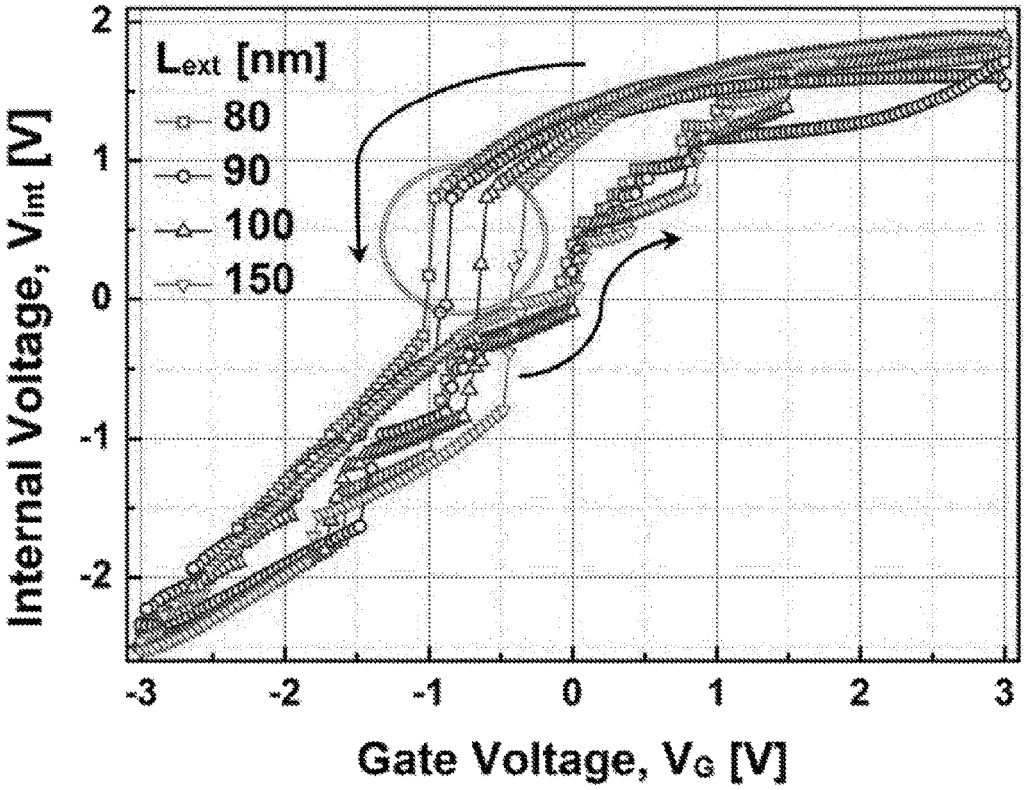
FIGS. 5A-5B provide diagrams showing an internal voltage and an internal voltage gain of a negative capacitance FinFET device in accordance with an exemplary embodiment of the present disclosure.
Figure 5B:
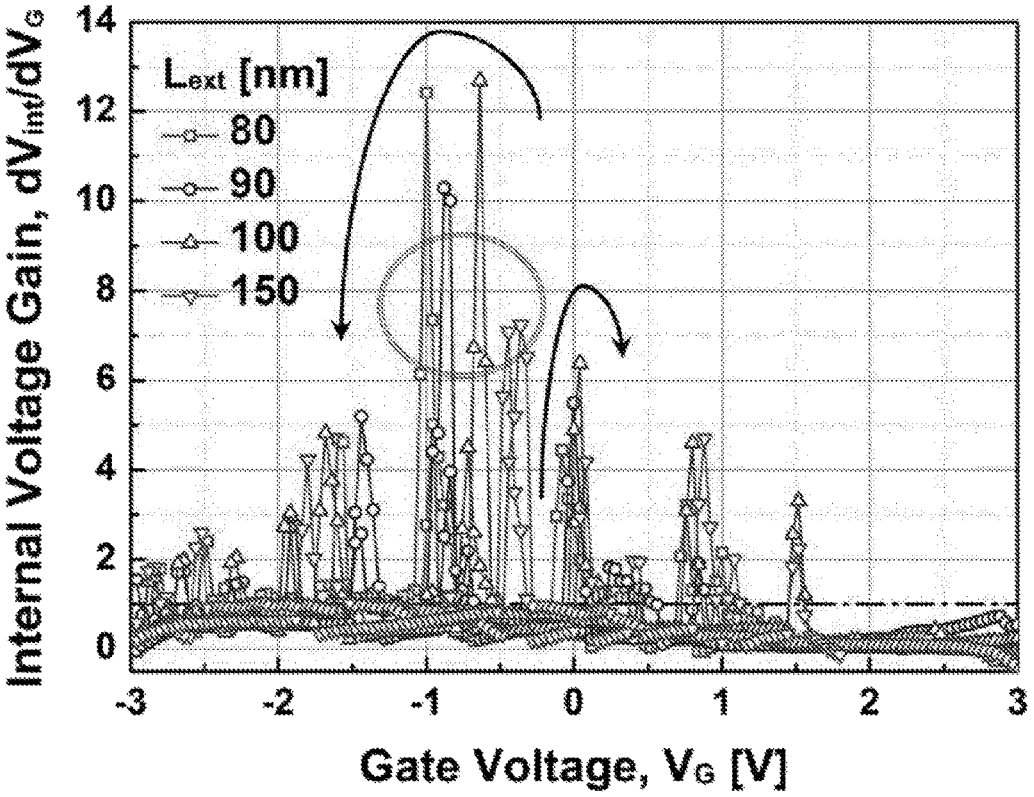

FIG. 5A shows the relationship between a gate voltage and an internal voltage of the negative capacitance FinFET device in accordance with an exemplary embodiment of the present disclosure. FIG. 5b is a diagram showing a gate voltage and an internal voltage gain of the negative capacitance FinFET device in accordance with an exemplary embodiment of the present disclosure.

The red circled regions in FIG. 5A and FIG. 5B show the amplification of the internal voltage ($V_{int}$) at regular intervals of the gate voltage ($V_G$) for various extension lengths ($L_{ext}$). In the reverse sweep, the internal voltage ($V_{int}$) is amplified at the lowest value of $|V_G|$ in the negative capacitance FinFET device 1 with the extension length ($L_{ext}$) of 150 nm, which results in the lowest hysteresis window.

However, in the forward sweep, the extension length ($L_{ext}$) does not significantly affect the input transfer characteristics. Since the amplification of the internal voltage ($V_{int}$) in the forward sweep occurs at $V_G$=0 V, the difference between the parasitic gate-to-source capacitance ($C_{GS}$) and the parasitic gate-to-drain capacitance ($C_{GD}$) for various extension lengths ($L_{ext}$) is negligible. Hence, the $|V_G|$ for amplification of the internal voltage ($V_{int}$) is identical.

Method of Manufacturing Negative Capacitance FinFET Device

Figure 6:
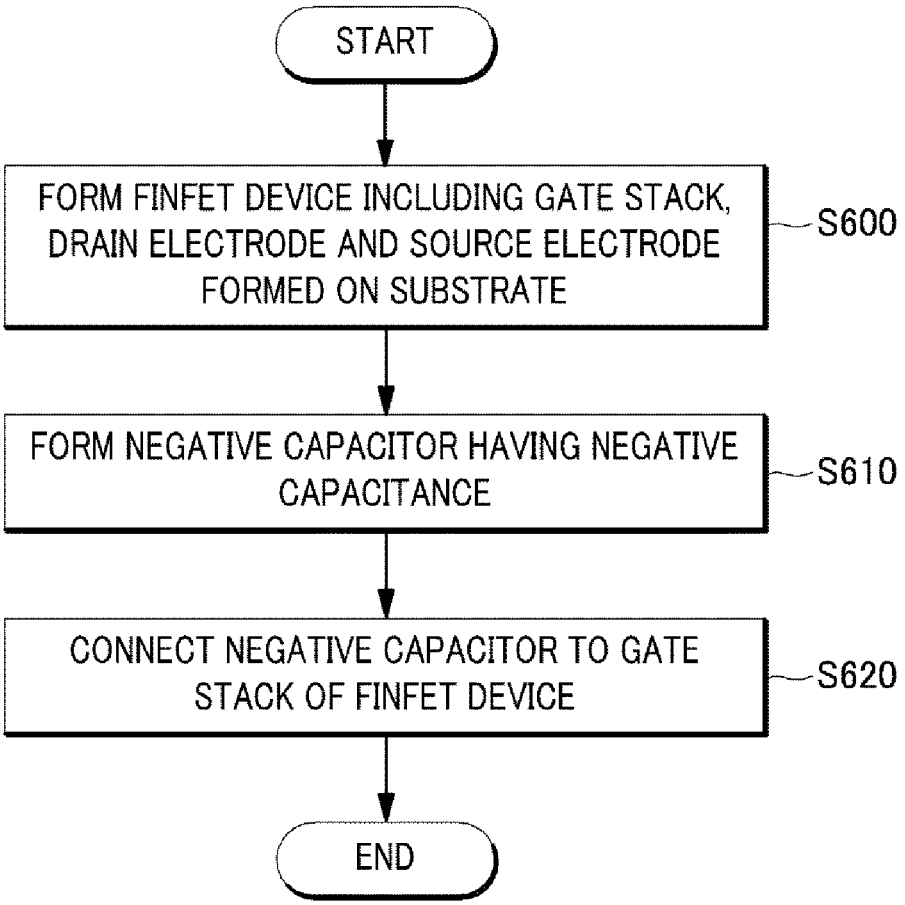
FIG. 6 is a flowchart illustrating a method of manufacturing a negative capacitance FinFET device in accordance with an exemplary embodiment of the present disclosure.

FIG. 6 is a flowchart illustrating a method of manufacturing a negative capacitance FinFET device in accordance with an exemplary embodiment of the present disclosure. Referring to FIG. 6, in S600, the FinFET device 110 including the gate stack 114, the drain electrode 118 and the source electrode 116 formed on the substrate 112 is formed.

In S610, the ferroelectric negative capacitor 120 having a negative capacitance is formed. In S620, the ferroelectric negative capacitor 120 is connected to the gate stack 114 of the FinFET device 110.

Herein, the FinFET device 110 has the extension length ($L_{ext}$) from the side-wall of the gate stack 14 to the drain electrode 118 or the source electrode 116. The extension length ($L_{ext}$) may be set such that a size of a hysteresis window in the negative capacitance FinFET device 1 to be 1 V or less.

For example, the extension length ($L_{ext}$) may be set to be in a range from 80 nm to 150 nm. For example, the extension length ($L_{ext}$) may be set to be in a range from 120 nm to 150 nm.

For example, the size of the hysteresis window in the negative capacitance FinFET device 1 may be from 0.4 V to 0.5 V.

For example, a subthreshold slope of the negative capacitance FinFET device 1 may be from 5 mV/decade to 60 mV/decade at room temperature. For example, a subthreshold slope of the negative capacitance FinFET device 1 may be from 5 mV/decade to 20 mV/decade at room temperature.

Figure 7:
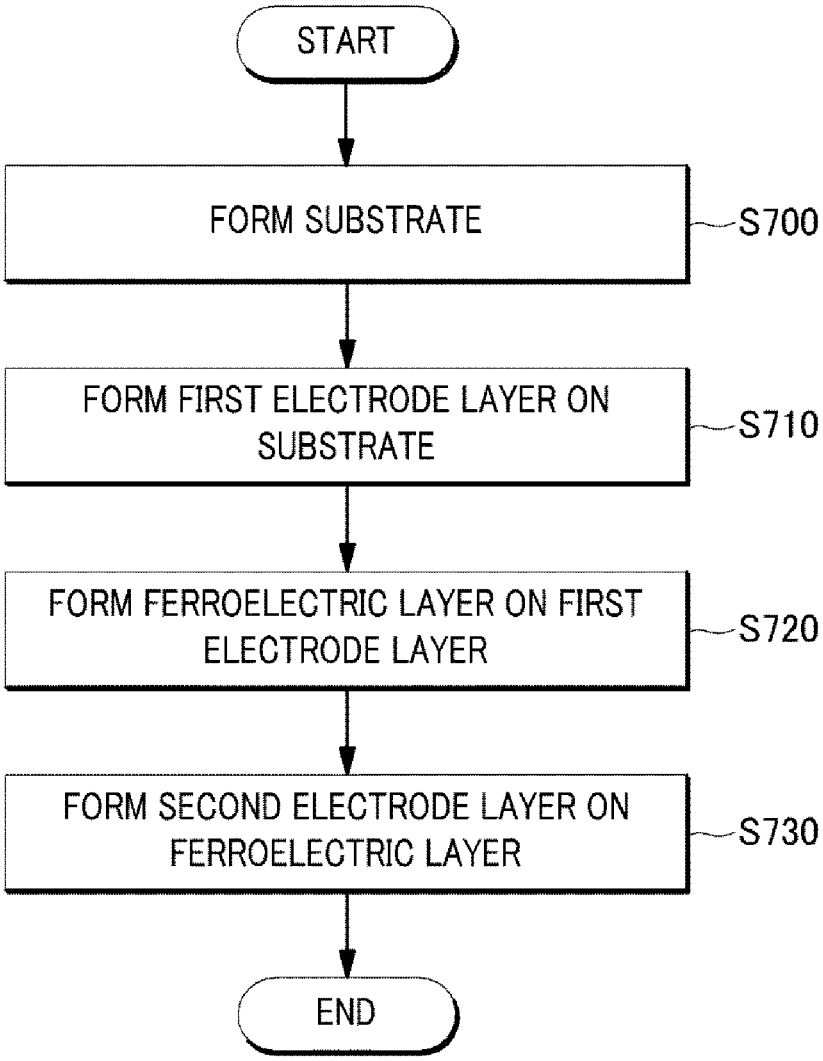
FIG. 7 is a flowchart illustrating a method of manufacturing a ferroelectric negative capacitor in accordance with an exemplary embodiment of the present disclosure.

FIG. 7 is a flowchart illustrating a method of manufacturing a ferroelectric negative capacitor in accordance with an exemplary embodiment of the present disclosure. Referring to FIG. 7, in S700, the substrate 122 is formed. In S710, the first electrode layer 124 is formed on the substrate 122.

In S720, the ferroelectric layer 126 is formed on the first electrode layer 124. In S730, the second electrode layer 128 is formed on the ferroelectric layer 126.

Herein, the first electrode layer 124 may be formed of, for example, lantanium strontium manganite ($La_{0.7}Sr_{0.3}MnO_3$; LSMO). Otherwise, the first electrode layer 124 may be formed of a material including at least one of gold (Au), gadolinium scandate ($GdScO_3$), silicon (Si), polysilicon, copper (Cu), silver (Ag), molybdenum (Mo), nickel (Ni), platinum (Pt), titanium (Ti), tantalum (Ta), and ruthenium (Ru).

The second electrode layer 128 may be formed of, for example, gold (Au)-titanium (Ti)-gold (Au). Otherwise, the is second electrode layer 128 may be formed of a material including at least one of strontium ruthenate ($SrRuO_3$), silicon (Si), polysilicon, copper (Cu), silver (Ag), molybdenum (Mo), nickel (Ni), platinum (Pt), titanium (Ti), tantalum (Ta), and ruthenium (Ru).

Further, the ferroelectric layer 126 may be formed of, for example, lead zirconium titanate ($PbZrTiO_3$). Otherwise, the ferroelectric layer 126 may be formed of a material including at least one of PVDF [poly(vinylidenefluoride)], P(VDF-TrFE) [poly(vinylidenefluoride-trifluoroethylene)], PZT (lead zirconate titanate), BTO (barium titanate), BLT (bismuth lanthanum titanate), SBT (strontium bismuth tantalate), SLT (near-stoichiometric lithium tantalate), silicon-doped hafnium oxide (Si-doped $HfO_2$), and hafnium zirconium oxide ($HfZrO_2$).

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A negative capacitance [FinFET] *FET* device comprising:

a [FinFET] *FET* device including a *fin, a* gate stack *on the fin*, a drain electrode and a source electrode [formed on a substrate], *which are electrically connected to the fin on opposing sides of the gate stack*; and a ferroelectric negative capacitor connected to the gate stack of the [FinFET] *FET* device and having a negative capacitance, wherein the [FinFET] *FET* device has an extension length ($L_{ext}$) from a side-wall of the gate stack to the drain electrode or the source electrode, and the extension length is set such that a size of a hysteresis window in the negative capacitance [FinFET] *FET* device is *in a range from 0.4 V to* 1 V or less.

2. The negative capacitance [FinFET] *FET* device of claim 1, wherein the extension length is set to be in a range from 80 nm to 150 nm.

3. The negative capacitance [FinFET] *FET* device of claim 1, wherein the extension length is set to be in a range from 120 nm to 150 nm.

4. The negative capacitance [FinFET] *FET* device of claim 3, wherein the size of the hysteresis window in the negative capacitance [FinFET] *FET* device is from 0.4 V to 0.5 V.

5. The negative capacitance [FinFET] *FET* device of claim 1, wherein a subthreshold slope (SS) of the negative capacitance [FinFET] *FET* device is from 5 mV/decade to 60 mV/decade at room temperature.

6. The negative capacitance [FinFET] *FET* device of claim 1, wherein a subthreshold slope (SS) of the negative capacitance [FinFET] *FET* device is from 5 mV/decade to 20 mV/decade at room temperature.

7. The negative capacitance [FinFET] *FET* device of claim 1, wherein the ferroelectric negative capacitor includes:

a substrate;

a first electrode layer formed on the substrate;

a ferroelectric layer formed on the first electrode layer; and a second electrode layer formed on the ferroelectric layer.

8. The negative capacitance [FinFET] *FET* device of claim 7, wherein the first electrode layer and the second electrode layer include at least one of [lantanium] *lanthanum* strontium manganite ($La_{0.7}Sr_{0.3}MnO_3$; LSMO), gold (Au), gadolinium scandate ($GdScO_3$), strontium ruthenate ($SrRuO_3$), silicon (Si), polysilicon, copper (Cu), silver (Ag), molybdenum (Mo), nickel (Ni), platinum (Pt), titanium (Ti), tantalum (Ta), and ruthenium (Ru).

9. The negative capacitance [FinFET] *FET* device of claim 7, wherein the ferroelectric layer includes at least one of PVDF [poly(vinylidenefluoride)], P(VDF-TrFE) [poly (vinylidenefluoride-trifluoroethylene)], PZT (lead zirconate titanate), BTO (barium titanate), BLT (bismuth lanthanum titanate), SBT (strontium bismuth tantalate), SLT (near-stoichiometric lithium tantalate), silicon-doped hafnium oxide (Si-doped $HfO_2$), hafnium zirconium oxide ($HfZrO_2$), and $PbZrTiO_3$.

[10. A manufacturing method of a negative capacitance FinFET device, comprising:

forming, on a substrate, a FinFET device including a gate stack, a drain electrode and a source electrode;

forming a ferroelectric negative capacitor having a negative capacitance; and connecting the ferroelectric negative capacitor to the gate stack of the FinFET device, wherein the FinFET device has an extension length ($L_{ext}$) from a side-wall of the gate stack to the drain electrode or the source electrode, and the extension length is set such that a size of a hysteresis window in the negative capacitance FinFET device is 1 V or less.]

[11. The manufacturing method of claim 10, wherein the extension length is set to be in a range from 80 nm to 150 nm.]

[12. The manufacturing method of claim 10, wherein the extension length is set to be in a range from 120 nm to 150 nm.]

[13. The manufacturing method of claim 12, wherein the size of the hysteresis window in the negative capacitance FinFET device is from 0.4 V to 0.5 V.]

[14. The manufacturing method of claim 10, wherein a subthreshold slope (SS) of the negative capacitance FinFET device is from 5 mV/decade to 60 mV/decade at room temperature.]

[15. The manufacturing method of claim 10, wherein a subthreshold slope (SS) of the negative capacitance FinFET device is from 5 mV/decade to 20 mV/decade at room temperature.]

[16. The manufacturing method of claim 10, wherein the forming of a ferroelectric negative capacitor includes:

forming a substrate;

forming a first electrode layer on the substrate;

forming a ferroelectric layer on the first electrode layer; and forming a second electrode layer on the ferroelectric layer.]

[17. The manufacturing method of claim 16, wherein the first electrode layer and the second electrode layer include at least one of lantaniumstrontium manganite ($La_{0.7}Sr_{0.3}MnO_3$; LSMO), gold (Au), gadolinium scandate ($GdScO_3$), strontium ruthenate ($SrRuO_3$), silicon (Si), polysilicon, copper (Cu), silver (Ag), molybdenum (Mo), nickel (Ni), platinum (Pt), titanium (Ti), tantalum (Ta), and ruthenium (Ru).]

[18. The manufacturing method of claim 16, wherein the ferroelectric layer includes at least one of PVDF [poly(vinylidenefluoride)], P(VDF-TrFE) [poly(vinylidenefluoride-trifluoroethylene)], PZT (lead zirconate titanate), BTO (barium titanate), BLT (bismuth lanthanum titanate), SBT (strontium bismuth tantalate), SLT (near-stoichiometric lithium tantalate), silicon-doped hafnium oxide (Si-doped $HfO_2$), hafnium zirconium oxide ($HfZrO_2$), and $PbZrTiO_3$.]

*19. A negative capacitance FET device, comprising:*

*a ferroelectric negative capacitor;*

*a gate electrically connected to the ferroelectric negative capacitor;*

*a source electrode and a drain electrode on opposing sides of the gate, respectively, wherein the gate is spaced apart from the source electrode or the drain electrode by a distance such that a size of a hysteresis window in the negative capacitance FET device is in a range from 0.4 V to 1 V; and*

*a fin, which is electrically connected to the source and drain electrodes, and extends from the source electrode to the drain electrode and opposite the gate.*

*20. The negative capacitance FET device of claim 19,*

*wherein the ferroelectric negative capacitor comprises a first electrode layer, a second electrode layer, and a ferroelectric layer between the first and second electrode layers, and*

*wherein the gate is electrically connected to the first electrode layer of the ferroelectric negative capacitor.*

*21. The negative capacitance FET device of claim 20, wherein the first electrode layer and the second electrode layer include at least one of lanthanum strontium manganite ($La_{0.7}Sr_{0.3}MnO_3$; LSMO), gold (Au), gadolinium scandate ($GdScO_3$), strontium ruthenate ($SrRuO_3$), silicon (Si), polysilicon, copper (Cu), silver (Ag), molybdenum (Mo), nickel (Ni), platinum (Pt), titanium (Ti), tantalum (Ta), and ruthenium (Ru).*

*22. The negative capacitance FET device of claim 20, wherein the ferroelectric layer includes at least one of PVDF [poly(vinylidenefluoride)], P(VDF-TrFE) [poly(vinylidenefluoride-trifluoroethylene)], PZT (lead zirconate titanate), BTO (barium titanate), BLT (bismuth lanthanum titanate), SBT (strontium bismuth tantalate), SLT (near-stoichiometric lithium tantalate), silicon-doped hafnium oxide (Si-doped $HfO_2$), hafnium zirconium oxide ($HfZrO_2$), and $PbZrTiO_3$.*

*23. The negative capacitance FET device of claim 19, wherein a subthreshold slope (SS) of the negative capacitance FET device is from 5 mV/decade to 60 mV/decade at room temperature.*

*24. The negative capacitance FET device of claim 19, wherein the hysteresis window in the negative capacitance FET device is from 0.4V to 0.5V.*

*25. The negative capacitance FET device of claim 19, wherein a driving voltage of the negative capacitance FET device is 0.5V or less.*

*26. A FET device, comprising:*

*a semiconductor fin having a gate stack thereon, which is capacitively coupled to a ferroelectric layer that provides negative capacitance characteristics to the FET device; and*

*a source electrode and a drain electrode electrically connected to opposing ends of the semiconductor fin on opposing sides of the gate stack, said gate stack having a sidewall spaced apart from the source electrode or the drain electrode by a sufficient distance to yield a hysteresis window within an $I_D$ versus $V_G$ characteristic of the FET device, which is in a range from 0.4 V to 1 V, where $I_D$ and $V_G$ correspond to a drain current and a gate voltage in the FET device, respectively.*

*27. The FET device of claim 26, wherein the ferroelectric layer includes at least one of PVDF [poly(vinylidenefluoride)], P(VDF-TrFE) [poly(vinylidenefluoride-trifluoroethylene)], PZT (lead zirconate titanate), BTO (barium titanate), BLT (bismuth lanthanum titanate), SBT (strontium bismuth tantalate), SLT (near-stoichiometric lithium tantalate), silicon-doped hafnium oxide (Si-doped $HfO_2$), hafnium zirconium oxide ($HfZrO_2$), and $PbZrTiO_3$.*

*28. The FET device of claim 26, wherein a subthreshold slope (SS) of the FET device is in a range from 5 mV/decade to 60 mV/decade at room temperature.*

*29. The FET device of claim 26, wherein a driving voltage of the FET device is 0.5V or less; and wherein the sidewall of the gate stack is spaced from the source electrode or the drain electrode by an extension length ($L_{ext}$) in a range from 80 nm to 150 nm.*

* * * * *